(12) United States Patent
Chowdhury et al.

(10) Patent No.: US 8,943,392 B2
(45) Date of Patent: Jan. 27, 2015

(54) VITERBI BUTTERFLY OPERATIONS

(71) Applicant: Texas Instruments, Incorporated, Dallas, TX (US)

(72) Inventors: Prohor Chowdhury, Bangalore (IN); Alexander Tessarolo, Lindfield (AU)

(73) Assignee: Texas Instruments Incorporated, Dallas, TX (US)

( * ) Notice: Subject to any disclaimer, the term of this patent is extended or adjusted under 35 U.S.C. 154(b) by 226 days.

(21) Appl. No.: 13/669,447

(22) Filed: Nov. 6, 2012

(65) Prior Publication Data

US 2014/0129908 A1   May 8, 2014

(51) Int. Cl.
*H03M 13/03* (2006.01)

(52) U.S. Cl.
USPC .......................................................... 714/795

(58) Field of Classification Search
CPC ................ H03M 13/6337; H03M 13/3776; H03M 13/3955; H03M 13/4176; H03M 13/4146; H03M 13/00; H03M 13/29; H03M 13/6505; H03M 13/23; H03M 13/6511; H03M 13/6563; H03M 13/4169; H03M 13/41; H03M 13/4107; H03M 13/6502; H03M 13/3961; G11B 20/10009
See application file for complete search history.

(56) References Cited

U.S. PATENT DOCUMENTS

| | | | | |
|---|---|---|---|---|
| 6,333,954 B1 * | 12/2001 | Hansquine | | 375/341 |
| 6,901,118 B2 * | 5/2005 | Hocevar et al. | | 375/341 |
| 7,853,855 B1 * | 12/2010 | He | | 714/755 |
| 8,301,990 B2 * | 10/2012 | Wilson et al. | | 714/795 |
| 2001/0044921 A1 * | 11/2001 | Takahashi et al. | | 714/795 |
| 2002/0129317 A1 * | 9/2002 | Nicol et al. | | 714/792 |
| 2004/0093553 A1 * | 5/2004 | Sipila | | 714/792 |
| 2006/0150058 A1 * | 7/2006 | Wang et al. | | 714/755 |
| 2007/0168846 A1 * | 7/2007 | Rho et al. | | 714/795 |
| 2008/0072129 A1 * | 3/2008 | Yamanaka et al. | | 714/796 |
| 2009/0077451 A1 * | 3/2009 | Ferguson | | 714/795 |

FOREIGN PATENT DOCUMENTS

WO    WO 0008768 A1 *  2/2000

OTHER PUBLICATIONS

Kanu Chadha and Joseph R. Cavallaro—A Reconfigurable Viterbi Decoder Architecture—2001 IEEE.*

* cited by examiner

*Primary Examiner* — Guerrier Merant
(74) *Attorney, Agent, or Firm* — John R. Pessetto; Frederick J. Telecky, Jr.

(57) ABSTRACT

A decoding system suitable for Viterbi decoding includes a decoder that includes a state metrics array, a butterfly unit, and a constraint length multiplexer. The state metrics array includes registers in which each register is arranged to store a state metric for processing. The butterfly unit includes an array of butterfly elements where each butterfly element is arranged to generate intermediate state metrics in parallel with other butterfly elements in the butterfly unit. The constraint length multiplexer unit is arranged to generate new state metrics in response to the intermediate state metrics and a Viterbi constraint length value stored in a constraint length register. Transition bits can also be generated in response to the constraint length.

12 Claims, 7 Drawing Sheets

US 8,943,392 B2

VITERBI BUTTERFLY OPERATIONS

BACKGROUND

The demand for higher performance processing continues to require further increases of computational capacity in the latest processors. For example, the growth in the extent and degree of wireless communications increases the need for increased processing. However, many high-end processors are not suited for wireless application because of power consumption and power handling requirements of such high-end processors.

SUMMARY

The problems noted above are solved in large part by a decoder that performer butterfly operations used in Viterbi decoding, for example. A decoding system suitable for Viterbi decoding is disclosed herein that includes a decoder that includes a state metrics array, a butterfly unit, and a constraint length multiplexer. The state metrics array includes registers in which each register is arranged to store a state metric for processing. The butterfly unit includes an array of butterfly elements where each butterfly element is arranged to generate intermediate state metrics in parallel with other butterfly elements in the butterfly unit. The constraint length multiplexer unit is arranged to generate new state metrics in response to the intermediate state metrics and a Viterbi constraint length value stored in a constraint length register. Transition bits can also be generated in response to the constraint length.

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component. Accordingly, distinctions are not necessarily made herein between components that differ in name but not function. In the following discussion and in the claims, the terms "including" and "comprising" are used in an open-ended fashion, and thus are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections.

Figure 1:
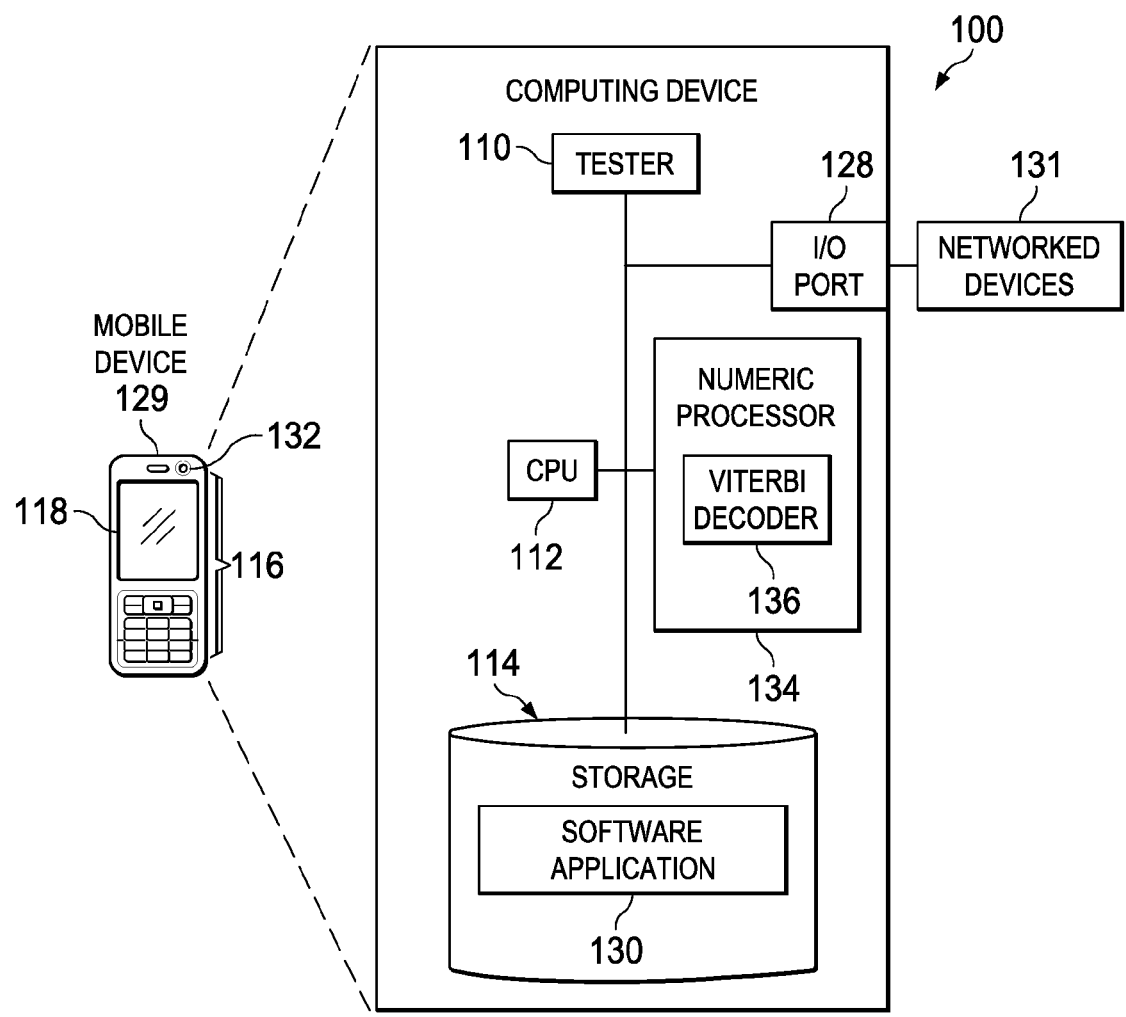
FIG. 1 shows an illustrative computing device in accordance with exemplary embodiments of the disclosure.

FIG. 1 shows an illustrative computing device 100 in accordance with preferred embodiments of the disclosure. For example, the computing device 100 is, or is incorporated into, a mobile communication device 129, such as a mobile phone, a personal digital assistant, a personal computer, automotive electronics, projection (and/or media-playback) unit, or any other type of electronic system.

In some embodiments, the computing device 100 comprises a megacell or a system-on-chip (SoC) which includes control logic such as a CPU 112 (Central Processing Unit), a storage 114 (e.g., random access memory (RAM)) and tester 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The tester 110 is a diagnostic system and comprises logic (embodied at least partially in hardware) that supports monitoring, testing, and debugging of the computing device 100 executing the software application 130. For example, the tester 110 can be used to emulate one or more defective or unavailable components of the computing device 100 to allow verification of how the component(s), were it actually present on the computing device 100, would perform in various situations (e.g., how the components would interact with the software application 130). In this way, the software application 130 can be debugged in an environment which resembles post-production operation.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, image projector 132, and the like. The input is received using audio and/or video inputs (using, for example, voice or image recognition), and mechanical devices such as keypads, switches, proximity detectors, and the like. The CPU 112 and tester 110 is coupled to I/O (Input-Output) port 128, which provides an interface (that is configured to receive input from (and/or provide output to) peripherals and/or computing devices 131, including tangible media (such as flash memory) and/or cabled or wireless media (such as a Joint Test Action Group (JTAG) interface). These and other input and output devices are selectively coupled to the computing device 100 by external devices using wireless or cabled connections.

The CPU 112 can include (or be coupled to) numeric processor 134, which can be arranged in a separate substrate from or the same substrate of the CPU 112. Numeric processor 134 is coupled to the CPU 112 and includes a Viterbi decoder 136 that is arranged to efficiently execute butterfly operations used in Viterbi decoding.

Convolution encoding (used in a transmitting device, for example) and Viterbi decoding (used in a receiving device, for example) is commonly used to increase the reliability of data communications in wireless applications such as radio, mobile, satellite communications, and the like. Performing Viterbi decoding in software often requires a relatively high amount of processing power, and as such, support for fast Viterbi decoding is often provided in digital signal processors (DSPs). However, the DSP-type processors are usually not suited for low power, low cost applications due to high operating frequencies that are typically in the gigahertz region.

In contrast, microcontrollers (MCUs) are suitable for low power, low cost applications due to lower operating frequencies that are typically in the megahertz region. Conventional MCUs microcontrollers are typically not suitable for Viterbi decoding related application because of the significantly slower operating frequencies and the cost-sensitive applications to which microcontroller-based solutions are employed.

Figure 2:
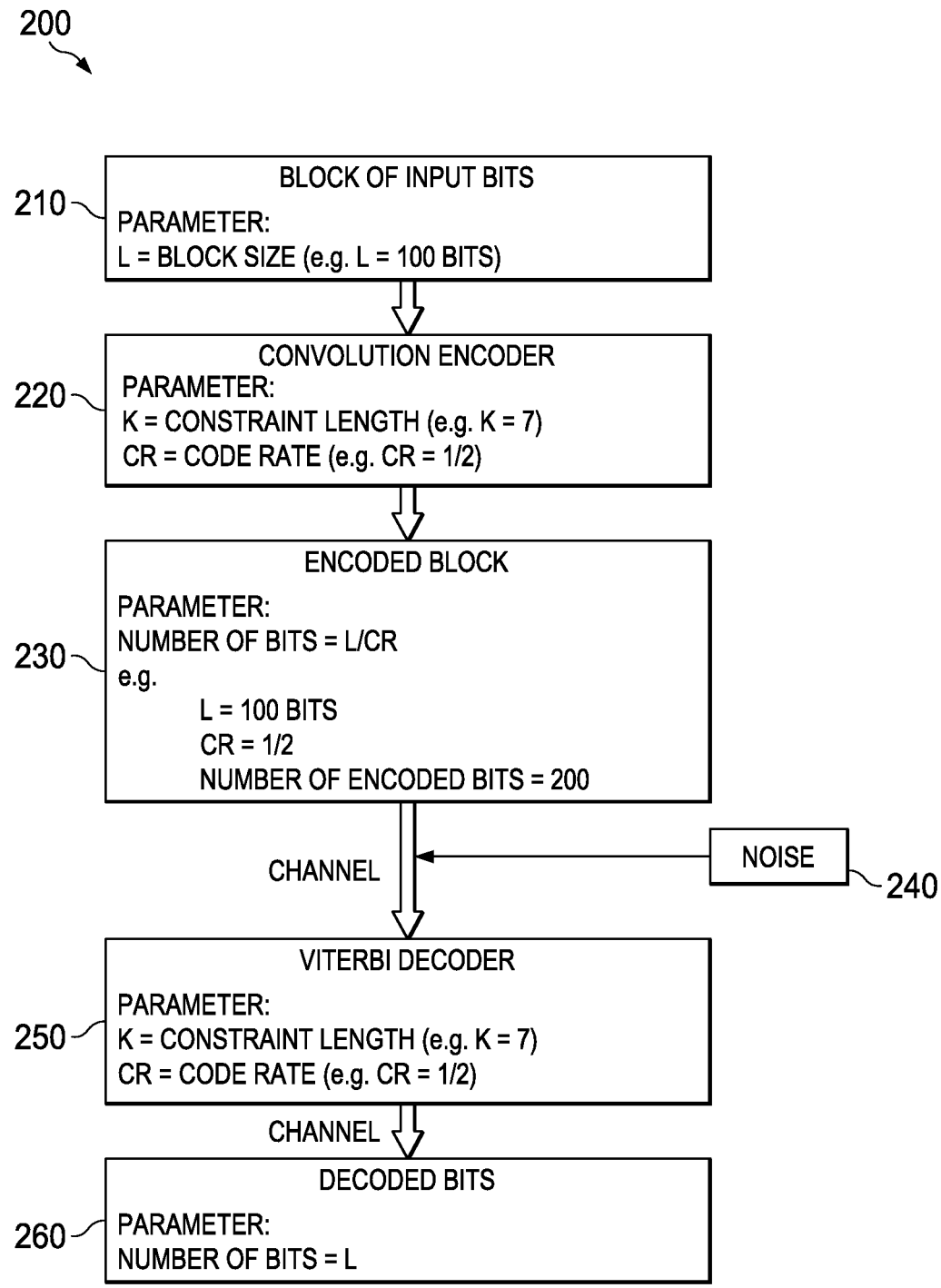
FIG. 2 is a block diagram illustrating a communication system for performing Viterbi butterfly operations in accordance with exemplary embodiments of the disclosure.

FIG. 2 is a block diagram illustrating a communication system for performing Viterbi butterfly operations in accordance with exemplary embodiments of the disclosure. Communication system 200 is illustrated as having a convolution encoder 220 that is arranged to receive a block of input bits 210 (e.g., having a length "L" of 100 bits). The input bits 210 are encoded using, for example, using a log likelihood ratio (LRR) encoding method. The convolution encoder 220 is arranged to transform the block of input bits to produce an encoded block 230 (e.g., having a length of 200 bits). The transformation is a function of a selected constraint length (where, e.g., the number "K" is seven) to realize a code rate of one-half (e.g., the ratio of the number of input bits to the number of encoded bits).

The error codes introduced by the convolution encoding increases the reliability of data transmission across a channel. For example, noise 240 can cause various transmitted encoded bits in a transmission signal to be degraded such that encoded bits in the degraded transmitted signal are read incorrectly.

The Viterbi decoder 250 is arranged to receive the (degraded) transmitted signal and to decode the received transmitted signal by determining errors in transmitted sequences and determining more-likely correct alternatives for sequences of the incorrectly read encoded bits. The Viterbi decoder 250 is arranged to decode the received encoded bits using the constraint length (e.g., a constraint length of seven) and the code rate (e.g., a code rate of one-half) that were used by the convolution encoder 220 that was used to encode the encoded bits. The Viterbi decoder 250 is arranged to generate a block of decoded bits 260, which—depending on the relative strength of noise 240—contains the information included in the block of input bits 210.

Figure 3:
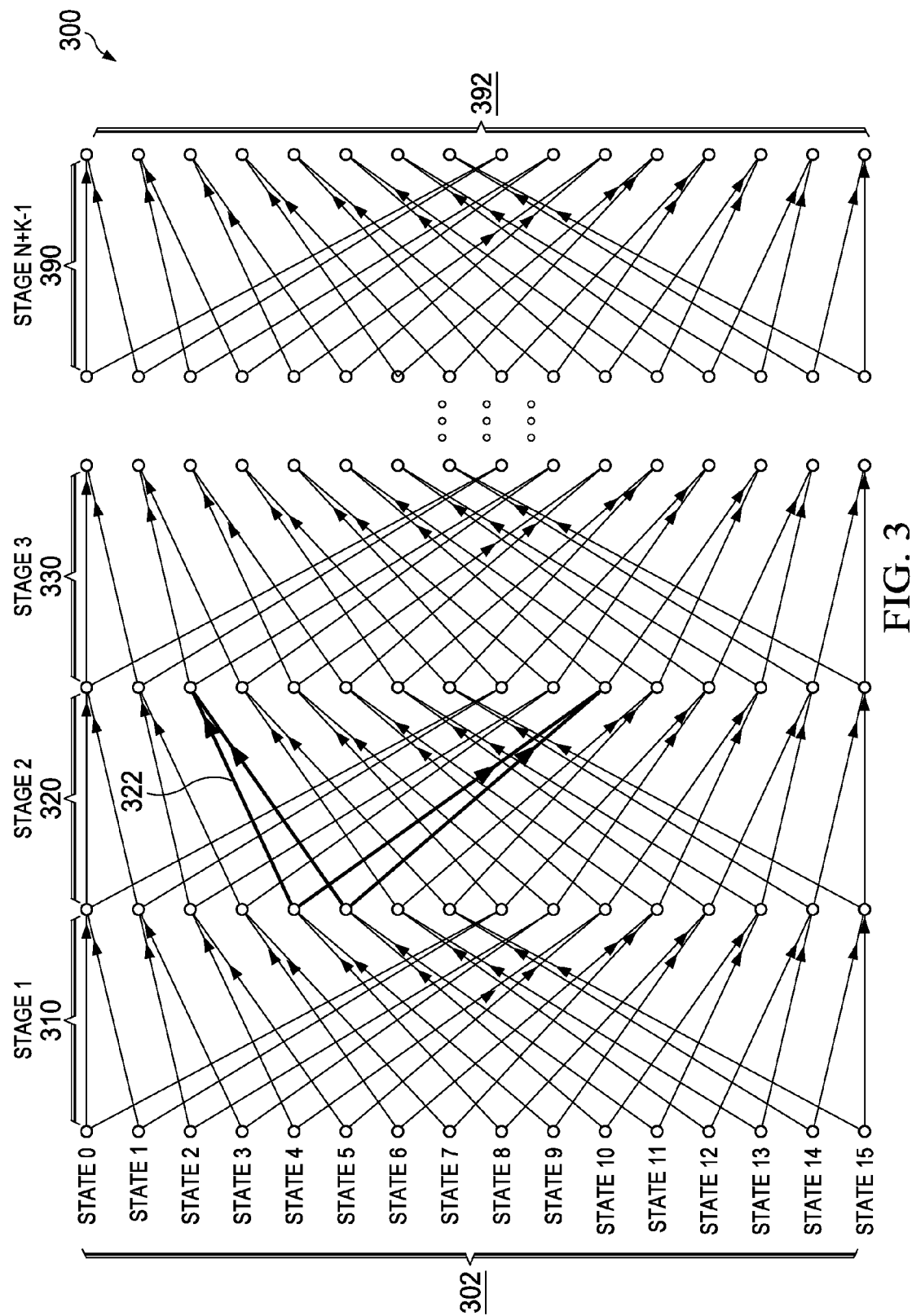
FIG. 3 is a trellis diagram that illustrates Viterbi butterfly operations performed by a Viterbi decoder in accordance with exemplary embodiments of the disclosure.

FIG. 3 is a trellis diagram that illustrates Viterbi butterfly operations performed by a Viterbi decoder in accordance with exemplary embodiments of the disclosure. Trellis 300 illustrates decoding of an input block having "N" number of bits and a constraint length "K," where K=7. Trellis 300 includes N+K−1 stages, illustrated as (for example) stage 1 (310), stage 2 (320), stage 3 (330), and so on through stage N+K−1 (390).

Each stage has a set of input states 302 that represent "source states" that are typically stored in device memory. (The initial state of the decoder is determined by a symbol input from a received encoded block.) The input states 302 are typically stored in dedicated memory (such as RAM) rather than in internal processor registers because of the relatively large amount of state metrics that are stored and read during normal Viterbi decoding. Each stage has a set of output states 392 that represent the output state metrics that result from a "butterfly operation," such as butterfly operation 322 in stage 2 (320) of the trellis 300. (A butterfly operation is discussed below with reference to FIG. 5.)

As illustrated here in FIG. 3, each butterfly operation involves four branches. Each branch represents calculations that are to be performed for that branch. The calculations use two state metrics as "source states" to calculate path metrics for each of the four branches associated with the butterfly. Likewise, branch metrics associated with each butterfly are calculated.

A processor used to perform the branch metrics and path metrics calculations can use internal and/or external memory to store and access operands used to perform the calculations. As mentioned above, memory accesses to memory external to the processor require much larger access times, which is aggravated by large numbers of memory accesses. In contrast, storing the operands using internal registers would require a relatively large number of registers that would adversely increase the size (including cost and power consumption) of the processor.

To generate the path metrics, branch metrics, state metrics, and transition bits for a butterfly operation, the processor reads two state metrics (which in conventional systems are typically stored in a state memory array that is external to the processor). The processor calculates path metrics for each of the four branches of the butterfly operation associated with each terminal node of the branches using the read state metrics, whereas the branch metrics can be calculated at the beginning of each stage independently of the calculation of the butterfly operations of each stage. For each of the two destination states, the processor compares the two path metrics associated with the branches terminating on each of them and generates the (new) state metrics and transition bits for each destination state. The computed state metrics and transition bits in conventional systems are typically stored in memory.

In conventional systems, a single Viterbi butterfly operation typically involves many external memory read/write cycles while involving relatively few internal operations. For example the add/subtract (ADD/SUB) operation that is used to perform the path metric calculations and the compare (COMP) operation that is used to perform output state-metrics and transition bit typically require (relatively slow) accesses to the (typically external) memory.

External memory read/write cycles (along with the internal operations repeated for each butterfly) makes the total processor cycle count of the Viterbi decoding algorithm relatively large. Thus, a reduction in the number of cycles used to compute a single butterfly operation substantially impacts the overall cycle count of the entire Viterbi decoding operation. Likewise, the external memory accesses create a bottleneck that prevents the butterfly operations within a single stage from being executed in parallel. In contrast, a Viterbi decoder is disclosed herein having a limited constraint length.

Figure 4:
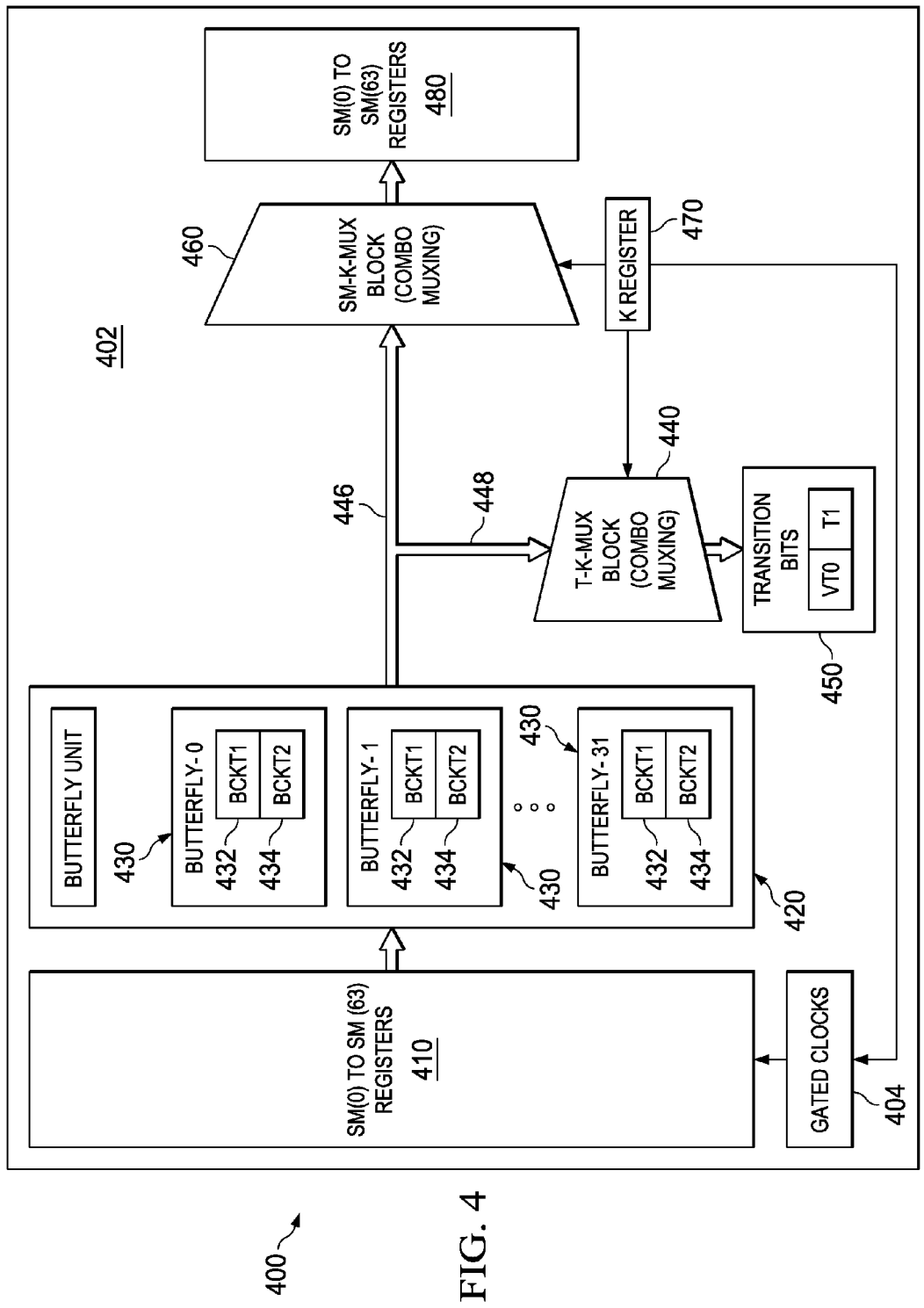
FIG. 4 is a block diagram illustrating a data path of a processor for performing Viterbi butterfly operations in accordance with exemplary embodiments of the disclosure.

FIG. 4 is a block diagram illustrating a data path of a processor for performing Viterbi butterfly operations in accordance with exemplary embodiments of the disclosure. Processor 400 is (and/or includes) a Viterbi decoder such as Viterbi decoder 136. Processor 400 includes state metrics registers 410, butterfly unit 420, intermediate state metrics bus 446, transition bits-constraint length multiplexers (T-K-Mux block) 440, transition bits register 450, state metrics-constraint length multiplexers (SM-K-Mux block) 460, constraint length (K) register 470, and state metrics registers 480.

Processor 400 includes a substrate 402 upon which the includes state metrics registers 410, butterfly unit 420, intermediate state metrics bus 446, transition bits-constraint length multiplexers (T-K-Mux block) 440, transition bits register 450, state metrics-constraint length multiplexers (SM-K-Mux block) 460, constraint length (K) register 470, and state metrics registers 480 are formed.

Processor 400 is illustrated herein having a constraint length that is limited to, for example, seven (e.g., with K<=7), so that the state metrics are limited to a state memory array size of 64 entries. A constraint length greater than seven can be used: however, the number of entries in the state memory array increases as a power of two (K−1 exponentiated to the power of 2). For example, with K=8, the number of entries is 128.

Processor 400 is, for example, a microcontroller (MCU) having the state memory array arranged as internal registers (e.g., not being stored in an external memory) such as state metrics registers 410. State metrics registers 410 typically includes 64 16-bit registers. Having the state memory array arranged as internal registers allows all the butterfly operations of a single stage to be parallelized. Accordingly, the number of multiple external memory read/write cycles for a butterfly operation is reduced (although at an increase of silicon area that is relatively nominal in view of the increased speed of the Viterbi decoding operation as discussed further below).

Processor 400 includes a butterfly unit 420 that is arranged to access the state metrics registers 410 to calculate intermediate path metrics for each of the state metrics registers 410. Butterfly unit 420 includes a plurality of butterfly elements 430. The plurality of butterfly elements 430 is used to calculate the intermediate path metrics for each of the state metrics registers 410 in parallel. When the number of butterfly elements 430 is half of the number of state metrics registers 410, the butterfly unit 420 can calculate the intermediate path metrics for each of the state metrics registers 410 at the same time. For example, when the number of state metrics registers is 64, a number of 32 butterfly elements 430 is sufficient to calculate the intermediate state metrics of a stage of processing at the same time.

Each butterfly element 430 is arranged to calculate intermediate path metrics for each of the four branches of the butterfly operation associated with each terminal node of the butterfly branches. Each butterfly element 430 includes butterfly circuits 432 and 434. The operation of butterfly element 430 and butterfly circuits 432 and 434 is more fully discussed with respect to FIG. 5 and FIG. 6 below.

The intermediate state metrics are used to generate the transition bits and state metrics to be used to generate transition bits and state metrics (for a next stage or for an end result). The intermediate transition bits are coupled (in parallel) to the transition bits-constraint length multiplexers (T-K-Mux block) 440 via intermediate transition bus 448. The intermediate state metrics are coupled (in parallel) to state metrics-constraint length multiplexers (SM-K-Mux block) 460 via intermediate state metrics bus 446. The T-K-Mux block 440 and the SM-K-Mux block 460 are arranged to receive the value of K as a control signal from K register 470.

When a constraint length of K<7 is used, unused registers of the state metrics registers 410 and transition bits register 450 are clock gated to save power. For example, when K=6, registers SM32 to SM63 of the state metrics registers 410 are clock gated; when K=5, registers SM16 to SM63 are clock gated; when K=4, registers SM8 to SM63 are clocked gated; and the like. If K<7, VT1 register is clock gated. Systems having constraint lengths greater than K=7 can incorporate power-saving clock gating in response to the constraint length for a larger range of corresponding registers.

The transition bits-constraint length multiplexers (T-K-Mux block) 440 is arranged to generate transition bits for transmission bits register 450 in response to the value of K. The generated bits are stored in registers VT0 and VT1 of the transmission bits register 450. When K=7, register VT0 stores the transition bits for the "0th" to 31st states and the register VT1 stores the transition bits for 32nd to 63rd states. Systems having constraint lengths greater than K=7 can incorporate larger transmission bits registers. The values stored in the transmission bits register 450 are used in a traceback operation to determine a high-likelihood path used in Viterbi decoding.

T-K-Mux block 440 is arranged to generate transition bits for transmission bits register 450 in accordance with the following:
If K=4
VT0 (0 to 3)←IT (3 downto 0);
VT0 (4 to 31): clock is gated;
VT1 (0 to 3)←IT (35 downto 32);
VT1 (4 to 31): clock gated;
If K=5
VT0 (0 to 7)←IT (7 downto 0);
VT0 (8 to 31): clock is gated;
VT1 (0 to 7)←IT (39 downto 32);
VT1 (8 to 31): clock gated;
If K=6
VT0 (0 to 15)←IT (15 downto 0);
VT0 (16 to 31): clock gated;
VT1 (0 to 15)←IT (47 downto 32);
VT1 (16 to 31): clock gated
If K=7
VT0 (0 to 31)←IT (31 downto 0);
VT1 (0 to 31)←IT (63 downto 32);
where "to" is an incrementing operator, "downto" is a decrementing operator, and "←" is an assignment operator. When K=4 for example, the value of register VT1[0] is assigned the value of intermediate transition bus 448 signal IT[7] and so on until the value of register VT1[3] is assigned the value of intermediate transition bus 448 signal IT[4]. (The values of other registers of transition bits register 450 are similarly assigned.)

The state metrics-constraint length multiplexers (SM-K-Mux block) 460 is arranged to generate new state metrics to be stored in state metrics register 480 in response to the value of K. For simplicity of illustration, state metrics register 480 is illustrated as being separate from state metrics register 410. When implemented in an actual system, the state metrics register 480 and the state metrics register are the same such that only one such state metrics register is used, and the original state metrics (used as inputs for a stage) are overwritten (as outputs of the stage). When K=7, state metrics register 480 stores the new state metrics for the "0th" to the 63rd states. Systems having constraint lengths greater than K=7 can incorporate larger state metrics registers as discussed above.

State metrics-constraint length multiplexers (SM-K-Mux block) 460 is arranged to generate a new state metric for state metrics register 480 in accordance with the following:

$SM[0] \leftarrow ISM[0];$ $SM[1] \leftarrow ISM[1];$ $SM[2] \leftarrow ISM[2];$ $SM[3] \leftarrow ISM[3];$ $SM[4] \leftarrow ISM[32]$ when $K = 4$ else $ISM[4];$ $SM[5] \leftarrow ISM[33]$ when $K = 4$ else $ISM[5];$ $SM[6] \leftarrow ISM[34]$ when $K = 4$ else $ISM[6];$ $SM[7] \leftarrow ISM[35]$ when $K = 4$ else $ISM[7];$ $SM[8] \leftarrow ISM[32]$ when $K = 5$ else $ISM[8];$ $SM[9] \leftarrow ISM[33]$ when $K = 5$ else $ISM[9];$ $SM[10] \leftarrow ISM[34]$ when $K = 5$ else $ISM[10];$ $SM[11] \leftarrow ISM[35]$ when $K = 5$ else $ISM[11];$ $SM[12] \leftarrow ISM[36]$ when $K = 5$ else $ISM[12];$ $SM[13] \leftarrow ISM[37]$ when $K = 5$ else $ISM[13];$ $SM[14] \leftarrow ISM[38]$ when $K = 5$ else $ISM[14];$ $SM[15] \leftarrow ISM[39]$ when $K = 5$ else $ISM[15];$ $SM[16] \leftarrow ISM[32]$ when $K = 6$ else $ISM[16];$ $SM[17] \leftarrow ISM[33]$ when $K = 6$ else $ISM[17];$ $SM[18] \leftarrow ISM[34]$ when $K = 6$ else $ISM[18];$ $SM[19] \leftarrow ISM[35]$ when $K = 6$ else $ISM[19];$ $SM[20] \leftarrow ISM[36]$ when $K = 6$ else $ISM[20];$ $SM[21] \leftarrow ISM[37]$ when $K = 6$ else $ISM[21];$ $SM[22] \leftarrow ISM[38]$ when $K = 6$ else $ISM[22];$ $SM[23] \leftarrow ISM[39]$ when $K = 6$ else $ISM[23];$ $SM[24] \leftarrow ISM[40]$ when $K = 6$ else $ISM[24];$ $SM[25] \leftarrow ISM[41]$ when $K = 6$ else $ISM[25];$ $SM[26] \leftarrow ISM[42]$ when $K = 6$ else $ISM[26];$ $SM[27] \leftarrow ISM[43]$ when $K = 6$ else $ISM[27];$ $SM[28] \leftarrow ISM[44]$ when $K = 6$ else $ISM[28];$ $SM[29] \leftarrow ISM[45]$ when $K = 6$ else $ISM[29];$ $SM[30] \leftarrow ISM[46]$ when $K = 6$ else $ISM[30];$ $SM[31] \leftarrow ISM[47]$ when $K = 6$ else $ISM[31];$ $SM[32] \leftarrow ISM[32];$ $SM[33] \leftarrow ISM[33];$

...

$SM[63] \leftarrow ISM[63];$ where "←" is an assignment operator and values of each state metrics register (SM[index>31]) having an index of 32 or greater (for systems implemented with a maximum constraint length of K=7) are assigned the corresponding value of the intermediate state metrics bus 446 signal (ISM[index>31]) having the same index. When K=7 for example, the value of register SM[31] is assigned the value of intermediate state metrics bus 446 signal ISM[31]. (The values of other registers of state metrics register 480 are similarly assigned.) When systems having constraint lengths of greater than seven are used, the assignments illustrated above can be extended to state metrics registers greater than 63 in accordance with the geometric progression inherent in the assignments illustrated above. The "new" state metrics are used as input state metrics (see, e.g., FIG. 3) for a next stage or as terminal state metrics (e.g., output state metrics of stage 390).

Figure 5:
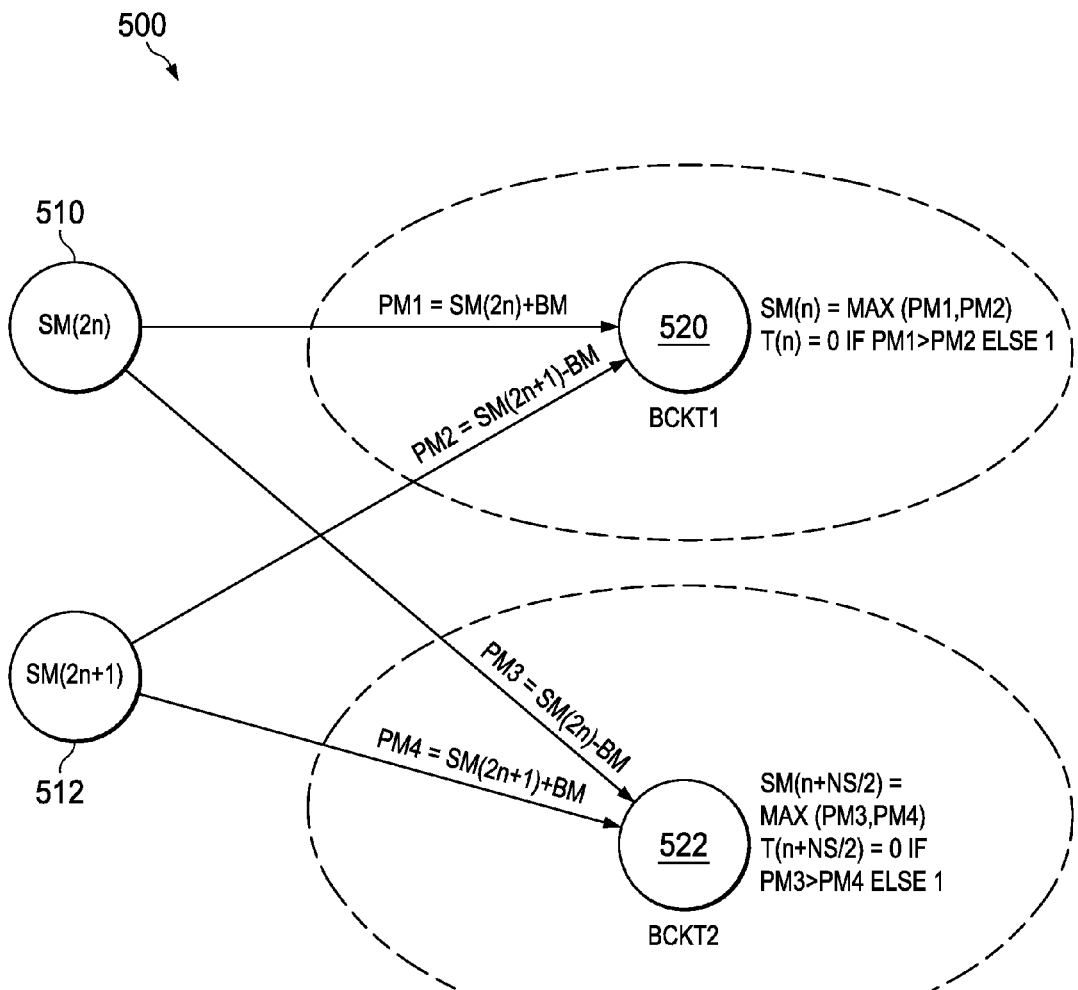
FIG. 5 is logic flow diagram illustrating Viterbi butterfly operations in accordance with exemplary embodiments of the disclosure.

FIG. 5 is a logic flow diagram illustrating Viterbi butterfly operations in accordance with exemplary embodiments of the disclosure. Flow diagram 500 is illustrated as a Viterbi butterfly having four nodes 510, 512, 520, and 522. Node 510 represents a state metrics register SM(2n), where "n" is the number of a butterfly in a stage (see, for example, butterfly 322 in FIG. 3). Node 512 represents a state metrics register SM(2n+1), which is a state metrics register that is adjacent to state metrics register SM(2n). Node 510 and Node 520 are thus an adjacent pair of state metrics registers.

Node 520 is associated with a butterfly circuit BCKT1 (such as butterfly circuit 432). Butterfly circuit BCKT1 is arranged to generate a first and second path metric in accordance with the equations PM1=SM(2n)+BM and PM2=SM(2n+1)−BM, where PM1 is the first path metric, PM2 is the second path metric, and BM is a branch metric (discussed below with respect to FIG. 6). Butterfly circuit BCKT1 is also arranged to generate a new state metric SM(n) in accordance with the equation SM(n)=MAX(PM1, PM2), where MAX is a comparison operation that selects the greater of PM1 and PM2. Butterfly circuit BCKT1 is also arranged to generate a transition bit T(n) in accordance with the equation T(n)=0 if PM1>PM2 else T(n)=1.

Node 522 is associated with a butterfly circuit BCKT2 (such as butterfly circuit 434). Butterfly circuit BCKT2 is arranged to generate a third and fourth path metric in accordance with the equations PM3=SM(2n)−BM and PM4=SM(2n+1)+BM. Butterfly circuit BCKT2 is also arranged to generate a new state metric SM(n+NS/2) in accordance with the equation SM(n+NS/2)=MAX(PM3, PM4), where NS is the number of state metric registers. Butterfly circuit BCKT2 is also arranged to generate a transition bit T(n+NS/2) in accordance with the equation T(n+NS/2)=0 if PM1>PM2 else T(n+NS/2)=1.

Figure 6:
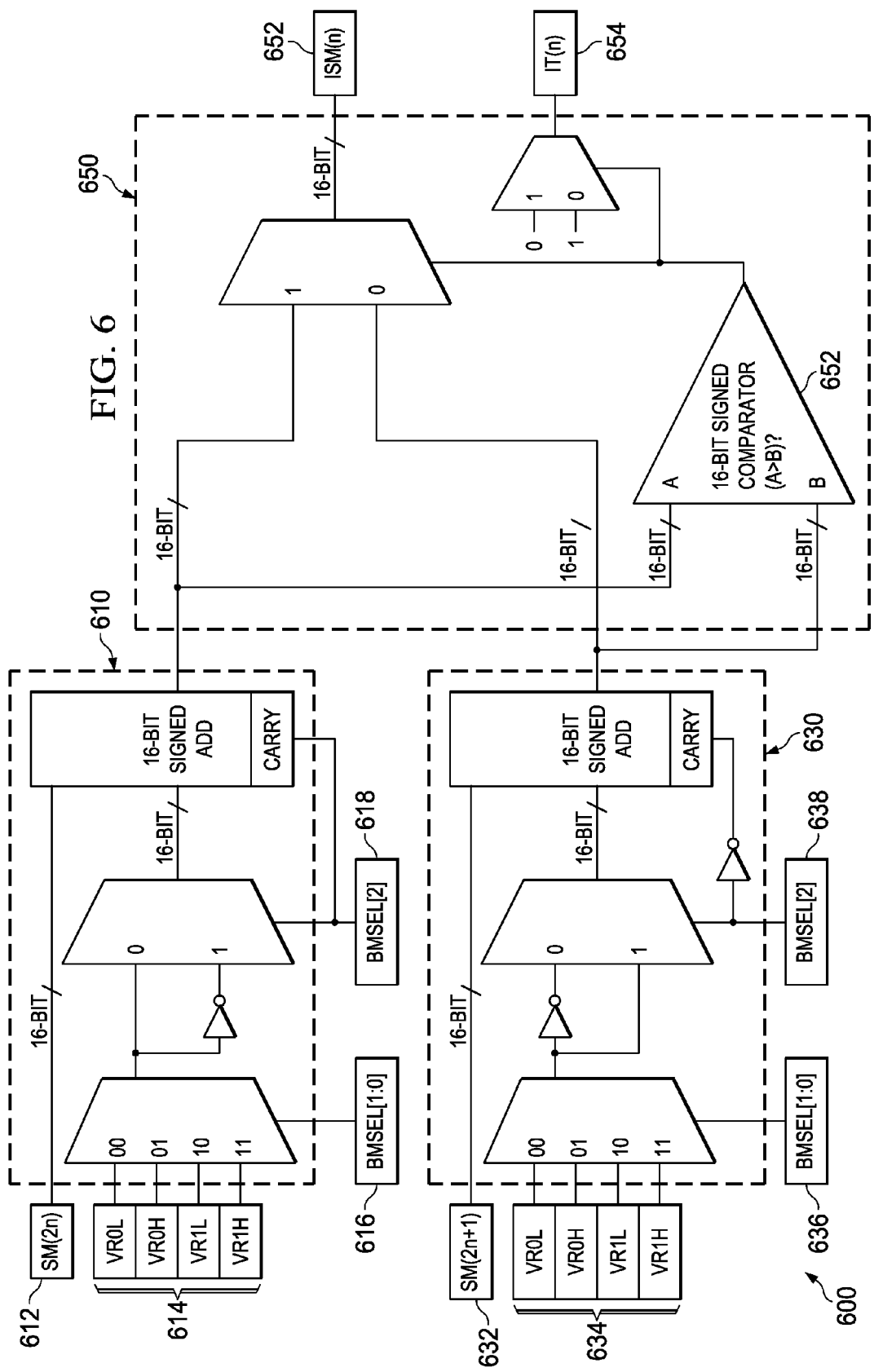
FIG. 6 is a logic diagram illustrating a first butterfly circuit for performing Viterbi butterfly operations in accordance with exemplary embodiments of the disclosure.

FIG. 6 is a logic diagram illustrating a first butterfly circuit for performing Viterbi butterfly operations in accordance with exemplary embodiments of the disclosure. Butterfly circuit 600 is an example of a butterfly unit 432 discussed above. Butterfly unit includes a first state metric-branch metric adder 610 (as used herein, an adder also can selectively subtract one input value from another input value), a second state metric-branch metric adder 620, and a multiplexer unit 650.

Butterfly circuit 610 is coupled to an input value 612 and an input value 614. The input value 612 is the value of state metrics register SM(2n), whereas the input value 614 are values stored in a branch metric register set. The branch metric register set stores the applicable branch metrics for the butterfly circuit 610 (as well as butterfly circuit 630). The applicable branch metric is selected by a branch metric select (BMSEL) register. BMSEL[1:0] (register 616) is used to specify which of the VR0L, VR0H, VR1L, and VR1H registers contains the applicable branch metric, whereas BMSEL[2] specifies the sign of (e.g., whether to add or subtract) the selected branch metric. BMSEL[2] is also coupled to the carry bit of a signed adder used to add the input value 612 and the input value 614 to produce a first path metric (e.g., PM1).

Butterfly circuit 630 is coupled to an input value 632 and an input value 634. The input value 632 is the value of state metrics register SM(2n+1), whereas the input value 634 are values stored in a branch metric register set. The branch metric register set stores the applicable branch metrics for the butterfly circuit 630 (as well as butterfly circuit 610). The applicable branch metric is selected by a branch metric select (BMSEL) register. BMSEL[1:0] (register 636) is used to specify which of the VR0L, VR0H, VR1L, and VR1H registers contains the applicable branch metric, whereas BMSEL [2] specifies the sign of (e.g., whether to subtract or add) the selected branch metric. BMSEL[2] is also coupled via inverter 640 to the carry bit of a signed adder used to add the input value 632 and the input value 634 to produce a second path metric (e.g., PM2).

The branch metric selection bits is arranged to code rates (CR) of CR=½ and CR=⅓ in accordance with Table 1.

TABLE 1

| BMSEL[2:0] | Branch Metrics Register | CR = ½<br>A = 1$^{st}$ Input<br>B = 2$^{nd}$ Input | CR = ⅓<br>A = 1$^{st}$ Input<br>B = 2$^{nd}$ Input<br>C = 3$^{rd}$ Input |
|---|---|---|---|
| 000 | VR0L | A + B | A + B + C |
| 001 | VR0H | A − B | A + B − C |
| 010 | VR1L | NA | A − B + C |
| 011 | VR1H | NA | A − B − C |
| 100 | −VR0L | −(A + B) | −(A + B + C) |
| 101 | −VR0H | −(A − B) | −(A + B − C) |
| 110 | −VR1L | NA | −(A − B + C) |
| 111 | −VR1H | NA | −(A − B − C) |

The BMSEL field of each of the 32 butterfly operations of a stage are stored in VR2, and VR3, VR4, and VR5 in accordance with Table 2 below.

TABLE 2

| Name/Bit(s) | Type | Reset | Description |
|---|---|---|---|
| VR2[3:0] | R/W | 0x0 | BMSEL[3:0] for Butterfly-0 |
| VR2[7:4] | R/W | 0x0 | BMSEL[3:0] for Butterfly-1 |
| VR2[11:8] | R/W | 0x0 | BMSEL[3:0] for Butterfly-2 |
| VR2[15:12] | R/W | 0x0 | BMSEL[3:0] for Butterfly-3 |
| VR2[19:16] | R/W | 0x0 | BMSEL[3:0] for Butterfly-4 |
| VR2[23:20] | R/W | 0x0 | BMSEL[3:0] for Butterfly-5 |
| VR2[27:24] | R/W | 0x0 | BMSEL[3:0] for Butterfly-6 |
| VR2[31:28] | R/W | 0x0 | BMSEL[3:0] for Butterfly-7 |
| VR3[3:0] | R/W | 0x0 | BMSEL[3:0] for Butterfly-8 |
| VR3[7:4] | R/W | 0x0 | BMSEL[3:0] for Butterfly-9 |
| VR3[11:8] | R/W | 0x0 | BMSEL[3:0] for Butterfly-10 |
| VR3[15:12] | R/W | 0x0 | BMSEL[3:0] for Butterfly-11 |
| VR3[19:16] | R/W | 0x0 | BMSEL[3:0] for Butterfly-12 |
| VR3[23:20] | R/W | 0x0 | BMSEL[3:0] for Butterfly-13 |
| VR3[27:24] | R/W | 0x0 | BMSEL[3:0] for Butterfly-14 |
| VR3[31:28] | R/W | 0x0 | BMSEL[3:0] for Butterfly-15 |
| VR4[3:0] | R/W | 0x0 | BMSEL[3:0] for Butterfly-16 |
| VR4[7:4] | R/W | 0x0 | BMSEL[3:0] for Butterfly-17 |
| VR4[11:8] | R/W | 0x0 | BMSEL[3:0] for Butterfly-18 |
| VR4[15:12] | R/W | 0x0 | BMSEL[3:0] for Butterfly-19 |
| VR4[19:16] | R/W | 0x0 | BMSEL[3:0] for Butterfly-20 |
| VR4[23:20] | R/W | 0x0 | BMSEL[3:0] for Butterfly-21 |
| VR4[27:24] | R/W | 0x0 | BMSEL[3:0] for Butterfly-22 |
| VR4[31:28] | R/W | 0x0 | BMSEL[3:0] for Butterfly-23 |
| VR5[3:0] | R/W | 0x0 | BMSEL[3:0] for Butterfly-24 |
| VR5[7:4] | R/W | 0x0 | BMSEL[3:0] for Butterfly-25 |
| VR5[11:8] | R/W | 0x0 | BMSEL[3:0] for Butterfly-26 |
| VR5[15:12] | R/W | 0x0 | BMSEL[3:0] for Butterfly-27 |
| VR5[19:16] | R/W | 0x0 | BMSEL[3:0] for Butterfly-28 |
| VR5[23:20] | R/W | 0x0 | BMSEL[3:0] for Butterfly-29 |
| VR5[27:24] | R/W | 0x0 | BMSEL[3:0] for Butterfly-30 |
| VR5[31:28] | R/W | 0x0 | BMSEL[3:0] for Butterfly-31 |

Multiplexer unit 650 is arranged to compare the first and second path metrics and to produce an intermediate state metric 652 for an intermediate state metrics bus (e.g., intermediate state metrics bus 446) and to produce transition bits 654 for an intermediate transition bits bus (e.g., intermediate transition bits bus 448). Multiplexer unit 650 includes comparator 652 that is arranged to compare the first and second path metrics and to produce a selection signal that is used to control selection in a first multiplexer that is arranged to produce the intermediate state metric 652 and to control selection in a second multiplexer that is arranged to produce the intermediate transition bit 654.

Figure 7:
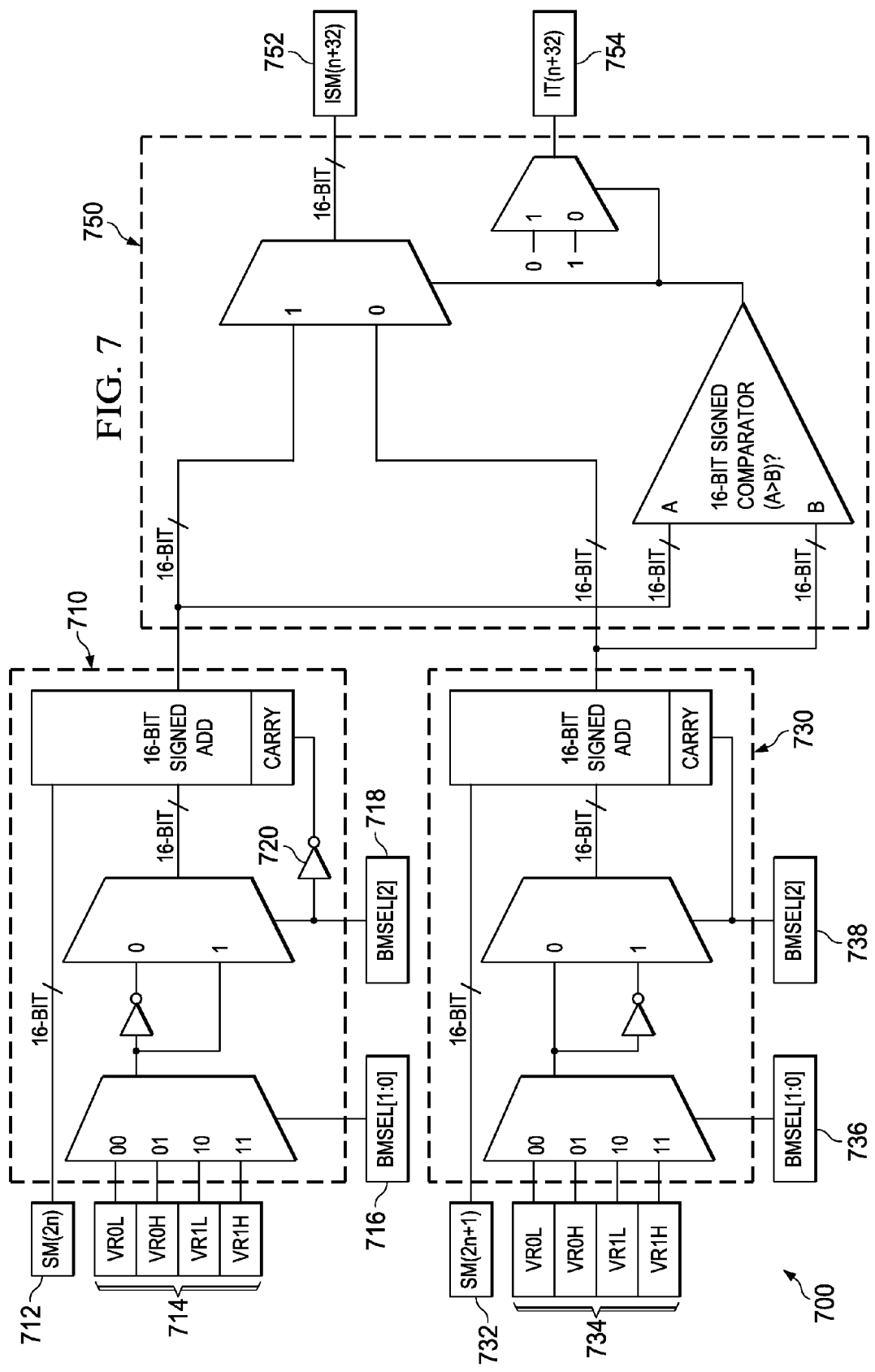
FIG. 7 is a logic diagram illustrating a second butterfly circuit for performing Viterbi butterfly operations in accordance with exemplary embodiments of the disclosure.

FIG. 7 is a logic diagram illustrating a first butterfly circuit for performing Viterbi butterfly operations in accordance with exemplary embodiments of the disclosure. Butterfly circuit 700 is an example of a butterfly unit 434 discussed above. Butterfly unit includes a first state metric-branch metric adder 710, a second state metric-branch metric adder 720, and a multiplexer unit 750.

Butterfly circuit 710 is coupled to an input value 712 and an input value 714. The input value 712 is the value of state metrics register SM(2n), whereas the input value 714 are values stored in a branch metric register set. The branch metric register set stores the applicable branch metrics for the butterfly circuit 710 (as well as butterfly circuit 730). The applicable branch metric is selected by a branch metric select (BMSEL) register. BMSEL[1:0] (register 716) is used to specify which of the VR0L, VR0H, VR1L, and VR1H registers contains the applicable branch metric, whereas BMSEL [2] specifies the sign of (e.g., whether to subtract or add) the selected branch metric. BMSEL[2] is also coupled via inverter 720 to the carry bit of a signed adder used to add the input value 712 and the input value 714 to produce a third path metric (e.g., PM3).

Butterfly circuit 730 is coupled to an input value 732 and an input value 734. The input value 732 is the value of state metrics register SM(2n+1), whereas the input value 734 are values stored in a branch metric register set. The branch metric register set stores the applicable branch metrics for the butterfly circuit 730 (as well as butterfly circuit 710). The applicable branch metric is selected by a branch metric select (BMSEL) register. BMSEL[1:0] (register 736) is used to specify which of the VR0L, VR0H, VR1L, and VR1H registers contains the applicable branch metric, whereas BMSEL [2] specifies the sign of (e.g., whether to add or subtract) the selected branch metric. BMSEL[2] is also coupled to the carry bit of a signed adder used to add the input value 732 and the input value 734 to produce a fourth path metric (e.g., PM4).

Multiplexer unit 750 is arranged to compare the third and fourth path metrics and to produce an intermediate state metric 752 for an intermediate state metrics bus (e.g., intermediate state metrics bus 446) and to produce transition bits 754 for an intermediate transition bits bus (e.g., intermediate transition bits bus 448). Multiplexer unit 750 includes comparator 752 that is arranged to compare the first and second path metrics and to produce a selection signal that is used to control selection in a first multiplexer that is arranged to produce the intermediate state metric 752 and to control selection in a second multiplexer that is arranged to produce the intermediate transition bit 754.

Code (include machine instructions) for performing Viterbi decoding using the Viterbi decoder disclosed herein can be expressed as follows:

```
;Initialization
MOVL XAR0, #LLR              ; Point to the beginning of LLR Array.
MOVL XAR1, #TRANS            ; Beginning of trans-bit array
MOVL XAR2, #CONFIG_DATA      ; Point to config data
VSETK #7                     ; K=7 is default, other values to be declared
VSMINIT *XAR2++              ;Initialize SM(0) to 0, SM(1) to SM(63) = [mem16]
ADDB XAR2, #1                ; Align XAR2
MOVL VR2, *XAR2++            ; Initialize MBSEL for butterfly 0 to 7
MOVL VR3, *XAR2++            ; Initialize MBSEL for butterfly 8 to 15
MOVL VR4, *XAR2++            ; Initialize MBSEL for butterfly 16 to 23
MOVL VR5, *XAR2++            ; Initialize MBSEL for butterfly 24 to 31
VITMB2 VR0, *XAR0++          ; Calculate and store BMs in VR0L and VR0H
                             ; A = [XAR0++][15:0], B = [XAR2==][31:16],
                             ; VR0L=A+B, VR0H=A−B
RPTB _stage_loop, #N/2-1     ; Compute N number of Viterbi Stages (last stage
                             ; outside the loop)
VITSTAGE || VITBM2 VR0, *XAR0++   ; Compute 32 parallel butterflies and
                             ; compute BM for next stage
VMOV32 *XAR1++, VT1          ; Store VT1 (T-BIT for states 32 to 63)
VMOV32 *XAR1++, VT0          ; Store VT0 (T-BIT for states 0 to 31)
_stage_loop:
; last stage processing
VITSTAGE                     ; Compute 32-butterfly in parallel
VMOV32 *XAR1++, VT1          ; Store VT1 (T-BIT for states 32 to 63)
VMOV32 *XAR1++, VT0          ; Store VT0 (T-BIT for states 0 to 31)
```

As disclosed herein, the instruction "VITSTAGE||VITBM2 VR0, *XAR0++" is arranged to be executed in parallel. For example, the instruction code (operation code) "VITSTAGE is arranged to direct the processor to simultaneously execute 32 butterfly operations with each other (by using butterfly unit 420, for example) and in response calculate new state metrics and transition bits for the next stage processing.

In an exemplary embodiment, a MCU core running C28x code with new instructions using the disclosed parallelized butterfly architecture was found to execute a Viterbi decoding forward path (ACS) portion of the code used in the G3 (Third Generation) standard with K=7, CR=½, L=2048, and Processing Time=2.2 ms in 6144 processing cycles. In contrast, a conventional MCU core running C28x native code was found to execute the Viterbi decoding forward path (ACS) portion of the code used in the G3 (Third Generation) standard with K=7, CR=½, L=2048, and Processing Time=2.2 ms in 917504 processing cycles. Accordingly, the disclosed technique represents an improvement of around 150 times the conventional art. Further (when using a design technology of 65 nm), the area used to implement an exemplary embodiment represented an increase of around 1.2% over the conventional MCU core running C28x native code.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A processor, comprising
a state metrics array having registers in which each register is arranged to store a state metric for processing;
a butterfly unit that includes an array of butterfly elements wherein each butterfly element is arranged to generate intermediate state metrics in parallel with other butterfly elements in the butterfly unit;
wherein each butterfly element is arranged to generate intermediate transition bits in parallel with other butterfly elements in the butterfly unit;
a constraint length multiplexer unit that is arranged to generate new state metrics in response to the intermediate state metrics and a Viterbi constraint length value stored in a constraint length register; and
a transition bits multiplexer unit that is arranged to generate the new state metrics in response to the intermediate transition bits and the Viterbi constraint length value stored in a constraint length register.

2. The device of claim 1, wherein the new state metrics are written in the state metrics array.

3. The device of claim 2, wherein the processor is arranged to generate the intermediate state metrics in parallel with other butterfly elements in the butterfly unit in response to an instruction code.

4. The device of claim 3, wherein the value of the constraint length is seven.

5. The device of claim 1, wherein the number of registers in the state metrics array is determined in accordance with $(K-1)$ exponentiated to the power of 2, where K is the value of the constraint length.

6. The device of claim 1, wherein the new state metrics are arranged to be used as input for a next stage that uses the butterfly unit.

7. The device of claim 1, wherein clocking of registers in the state metrics array is gated in response to the value of the constraint length select.

8. The device of claim 7, wherein when the constraint length value is less than seven, at least half of the registers in the state metrics array have gated clocks to conserve power.

9. The device of claim 1, wherein each butterfly element is arranged to generate four path metrics in response to the state metrics stored in a pair of adjacent registers in the state metrics array and in response to branch metrics that are associated with each butterfly element.

10. A communication system, comprising
a decoder that includes a state metrics array having registers in which each register is arranged to store a state metric for processing, a butterfly unit that includes an array of butterfly elements wherein each butterfly element is arranged to generate intermediate state metrics in parallel with other butterfly elements in the butterfly unit, and a constraint length multiplexer unit that is arranged to generate new state metrics in response to the intermediate state metrics and a Viterbi constraint length value stored in a constraint length register;

wherein each butterfly element is arranged to generate intermediate transition bits in parallel with other butterfly elements in the butterfly unit;

a processor that is arranged to perform a Viterbi decoding process using the decoder to perform Viterbi decoding stages;

a substrate in which the decoder and processor are arranged; and a transition bits multiplexer unit that is arranged to generate new state metrics in response to the intermediate transition bits and a Viterbi constraint length value stored in a constraint length register.

11. The system of claim 10, wherein the processor is arranged to determine the constraint length value.

12. The system of claim 10, wherein clocking of registers in the state metrics array is gated in response to the value of the constraint length.

* * * * *